(12) United States Patent
Okuno

(10) Patent No.: US 9,385,154 B2
(45) Date of Patent: Jul. 5, 2016

(54) SOLID-STATE IMAGE SENSOR, DRIVING METHOD AND ELECTRONIC APPARATUS

(71) Applicant: Sony Corporation, Tokyo (JP)

(72) Inventor: Jun Okuno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/828,368

(22) Filed: Mar. 14, 2013

(65) Prior Publication Data

US 2013/0258156 A1    Oct. 3, 2013

(30) Foreign Application Priority Data

Mar. 30, 2012   (JP) ................................. 2012-079578

(51) Int. Cl.
| | |
|---|---|
| H01L 27/146 | (2006.01) |
| H04N 5/363 | (2011.01) |
| H04N 5/359 | (2011.01) |
| H04N 9/04 | (2006.01) |

(52) U.S. Cl.
CPC .......... *H01L 27/14643* (2013.01); *H04N 5/359* (2013.01); *H04N 5/363* (2013.01); *H01L 27/14609* (2013.01); *H01L 27/14623* (2013.01); *H04N 9/045* (2013.01)

(58) Field of Classification Search
CPC .............................. H04N 5/365; H04N 5/3745
See application file for complete search history.

(56) References Cited

U.S. PATENT DOCUMENTS

| | | | | |
|---|---|---|---|---|
| 2005/0285971 | A1* | 12/2005 | Stavely | 348/364 |
| 2006/0132862 | A1* | 6/2006 | Morishita | 358/474 |
| 2009/0316030 | A1* | 12/2009 | Dai | 348/300 |
| 2009/0322917 | A1* | 12/2009 | Kyogoku et al. | 348/273 |
| 2012/0188424 | A1* | 7/2012 | Li | 348/294 |

FOREIGN PATENT DOCUMENTS

| | | |
|---|---|---|
| JP | 2003-319265 A | 11/2003 |
| JP | 2006-270292 A | 10/2006 |
| JP | 2010-098516 A | 4/2010 |
| JP | 2011-204878 A | 10/2011 |
| WO | 2012/004928 A1 | 1/2012 |

OTHER PUBLICATIONS

Japanese Office Action issued Jan. 20, 2016 for corresponding Japanese Application No. 2012-079578.

* cited by examiner

*Primary Examiner* — Jason Flohre

(74) *Attorney, Agent, or Firm* — Michael Best and Friedrich LLP

(57) ABSTRACT

There is provided a solid-state image sensor including a pixel region in which a plurality of pixels of a preset plurality of colors are arranged in a two-dimensional matrix shape, a vertical signal line corresponding to a pixel column of the pixel region, a trigger line corresponding to a pixel row of the pixel region and supplying a trigger pulse corresponding to each of the colors of the plurality of pixels, and a trigger pulse supply part supplying, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

18 Claims, 9 Drawing Sheets

SOLID-STATE IMAGE SENSOR, DRIVING METHOD AND ELECTRONIC APPARATUS

BACKGROUND

The present technology relates to a solid-state image sensor, a driving method and an electronic apparatus, and specifically, relates to a solid-state image sensor, a driving method and an electronic apparatus capable of securing simultaneity within the whole screen, and reducing the influence of the noise caused by leakage of signals in an image sensor.

CMOS image sensors have been widely used as image sensors in recent years. However, a CMOS image sensor performs readout sequentially pixel by pixel typically, and therefore, is difficult to attain simultaneity within the whole screen.

Namely, the CMOS image sensor performs readout operation of scanning sequentially pixel by pixel or row by row on photocharge generated and accumulated by a photoelectric conversion part. In case of this sequential scanning, that is, in case of a rolling shutter employed as an electronic shutter, it is difficult to match start times and end times of exposure for accumulating the photocharge for all the pixels. Hence, there is a problem that the sequential scanning causes distortion of a captured image in capturing images of a moving subject.

As the electronic shutter, a global shutter is employed in which the start of exposure and the end of exposure are performed identically in their timings for all the pixels in a pixel array, for the sensing usage in which this sort of distortion in image is not allowed, and the subject moving fast undergoes image capturing and/or simultaneity in captured image is expected.

A global shutter device which is a device employing the global shutter as an electronic shutter is provided with charge accumulation sections, for example, composed of semiconductor memories, in pixels. The device employing the global shutter transfers and accumulates charges from photodiodes into the semiconductor memories simultaneously, and after that, reads out them sequentially. Thereby, the simultaneity within the whole screen is secured.

Moreover, there is also proposed one which includes: a surface-embedded region for light receiving which is embedded in part of the upper portion of a semiconductor region and on which light is incident; and a charge accumulation region which is embedded in part of the upper portion of the semiconductor region, is deeper than the surface-embedded region for light receiving in depth of the potential well, and accumulates signal charge generated by the surface-embedded region for light receiving (for example, see Japanese Patent Laid-Open No. 2011-204878).

A CMOS image sensor employing the global shutter completely transfers signal charges generated by surface-embedded regions for light receiving to charge accumulation regions simultaneously for all the pixels, and next transfers them to charge readout regions and reads out them. Herein, in case of light received, for example, from the subject with high luminance during the charge holding, this causes leakage of signals from the surface-embedded region for light receiving to the charge readout region, and causes the noise.

Therefore, the device employing the global shutter expects a measure against the noise caused by the leakage of signals. In the technology of Japanese Patent Laid-Open No. 2011-204878, a light shielding film is selectively provided in the upper portion of the charge accumulation region in order to prevent light from leaking into the charge accumulation region, and thus, signals from being added during the signal charge being held in the charge accumulation region.

SUMMARY

However, it is known that output of the surface-embedded region for light receiving has dependency on a wavelength and/or an incident angle of incident light, and that the longer wavelength gives the larger amount thereof, for example.

For example, in case of using the technology of Japanese Patent Laid-Open No. 2011-204878, since signals are read out from pixels row by row, RG rows and BG rows are read out alternately, for example. Therefore, retention times for individual colors are identical to one another in the same row. In this case, there is a problem that the dependency on a wavelength and/or an incident angle of incident light causes difference in measurement of the noise between individual colors.

Moreover, in consideration of the influence of the noise caused by the leakage of signals during charge being held, retention times are desirable to be identical with one another for pixels at arbitrary positions within the screen.

However, there is a problem that difference in retention time between the row first read out and the row last read out is too large in the related art.

The present technology is disclosed in view of such circumstances, and it is desirable to secure simultaneity within the whole screen, and reduce the influence of the noise caused by leakage of signals in an image sensor.

According to a first embodiment of the present disclosure, there is provided a solid-state image sensor including a pixel region in which a plurality of pixels of a preset plurality of colors are arranged in a two-dimensional matrix shape, a vertical signal line corresponding to a pixel column of the pixel region, a trigger line corresponding to a pixel row of the pixel region and supplying a trigger pulse corresponding to each of the colors of the plurality of pixels, and a trigger pulse supply part supplying, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

The predetermined color may be determined based on noise characteristics defined according to the colors of the plurality of pixels.

The trigger pulse supply part may supply, via the trigger line, the trigger pulse in a manner that each signal voltage of a red pixel in the pixel region is read out for each pixel row via the vertical signal line, thereafter, each signal voltage of a green pixel in the pixel region is read out for each pixel row via the vertical signal line, and thereafter, each signal voltage of a blue pixel in the pixel region is read out for each pixel row via the vertical signal line.

The solid-state image sensor may further include a data conversion part converting the read-out signal voltage into digital data. A plurality of the vertical signal lines may correspond to the pixel column of the pixel region, and another data conversion part is supplied with each signal voltage read out via the respective plurality of vertical signal lines.

The trigger pulse supply part may supply, via the trigger line, the trigger pulse in a manner that each signal voltage of the pixel of the predetermined color in the pixel region is read out for every two rows in respect to the pixel row via the vertical signal line, and thereafter, each signal voltage of the pixel of the other color in the pixel region is read out for every two rows in respect to the pixel row via the vertical signal line.

The trigger pulse supply part may supply, via the trigger line, the trigger pulse in a manner that each signal voltage of the pixel of the predetermined color in the pixel region is read out for each pixel row via the vertical signal line in order from a pixel row located at a center of the pixel region, and thereafter, each signal voltage of the pixel of the other color in the pixel region is read out for each pixel row via the vertical signal line in order from the pixel row located at the center of the pixel region.

According to the first embodiment of the present disclosure, there is provided a driving method including providing a pixel region in which a plurality of pixels of a present plurality of colors are arranged in a two-dimensional matrix shape, a vertical signal line corresponding to a pixel column of the pixel region, and a trigger line corresponding to a pixel row of the pixel region and supplying a trigger pulse corresponding to each of the colors of the plurality of pixels, and supplying, by a trigger pulse supply part, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

According to a second embodiment of the present disclosure, there is provided an electronic apparatus including a solid-state image sensor including a pixel region in which a plurality of pixels of a present plurality of colors are arranged in a two-dimensional matrix shape, a vertical signal line corresponding to a pixel column of the pixel region, a trigger line corresponding to a pixel row of the pixel region and supplying a trigger pulse corresponding to each of the colors of the pixels, and a trigger pulse supply part supplying, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

According to the first and second embodiments of the present disclosure, there is provided a pixel region in which a plurality of pixels of a preset plurality of colors are arranged in a two-dimensional matrix shape, a vertical signal line corresponding to a pixel column of the pixel region, a trigger line corresponding to a pixel row of the pixel region and supplying a trigger pulse corresponding to each of the colors of the plurality of pixels, and a trigger pulse supply part supplying, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

According to the embodiments of the present disclosure described above, simultaneity within the whole screen can be secured, and the influence of the noise caused by leakage of signals in an image sensor can be reduced.

DETAILED DESCRIPTION OF THE EMBODIMENT(S)

Figure 1:
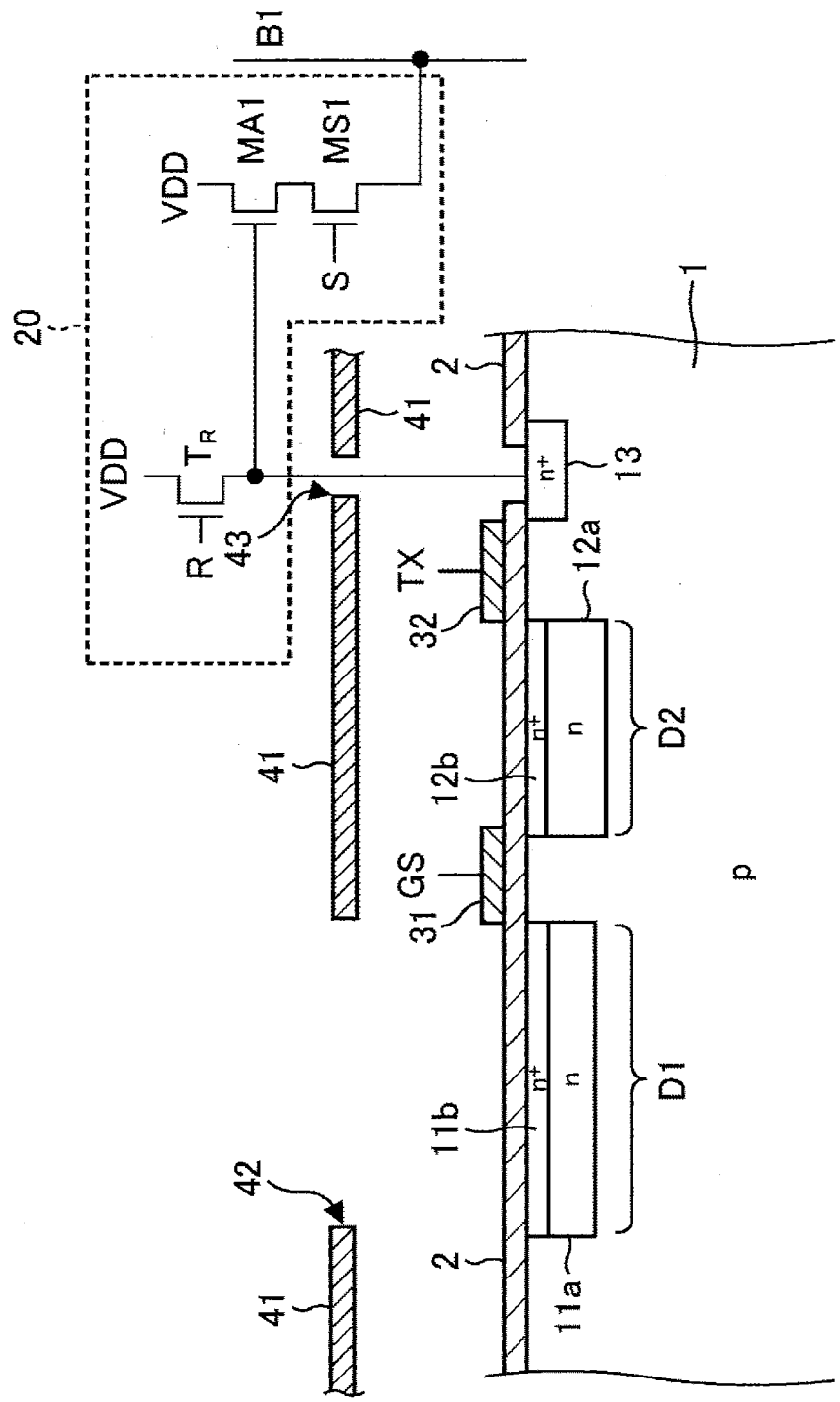
FIG. 1 is a diagram for explaining an exemplary configuration of a pixel of a CMOS image sensor employing a global shutter.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

At first, the problems regarding CMOS image sensors in the related art which employ a global shutter are described.

FIG. 1 is a diagram for explaining an exemplary configuration of a pixel of a CMOS image sensor employing a global shutter. The figure is a cross-sectional view of a semiconductor device included in the pixel of the CMOS image sensor.

As illustrated in the figure, the semiconductor device includes a semiconductor region 1 with first conductivity type (p-type), and a surface-embedded region 11a for light receiving (also referred to as a light receiving cathode region appropriately) with second conductivity type (n-type) which region is embedded in part of the upper portion of the semiconductor region 1 and on which region light is incident. Moreover, in part of upper portion of the semiconductor region 1, a charge accumulation region 12a with second conductivity type (n$^+$-type) which is embedded separate from the light receiving cathode region 11a, has a higher impurity density than that of the light receiving cathode region 11a, and accumulates signal charge generated by the light receiving cathode region 11a. Furthermore, a charge readout region 13 is provided and receives the signal charge accumulated by the charge accumulation region 12a.

In this example, a semiconductor substrate with first conductivity type is used as a "semiconductor region with first conductivity type," whereas a silicon epitaxial growth layer with first conductivity type having a lower impurity density than that of the semiconductor substrate which layer is formed on the semiconductor substrate with first conductivity type in place of the semiconductor substrate may be employed.

A photodiode D1 includes the light receiving cathode region 11a and the semiconductor substrate (anode region) 1 that is immediately beneath the light receiving cathode region 11a. A charge accumulation diode D2 includes the charge accumulation region (cathode region) 12a and the semiconductor substrate (anode region) that is immediately beneath the charge accumulation region 12a.

A p+-type pinning layer 11b is disposed on the light receiving cathode region 11a. A p+-type pinning layer 12b is disposed on the charge accumulation region 12a. The p+-type pinning layer 11b and p+-type pinning layer 12b are layers suppressing generation of carriers on the surface in the dark, and is used as a desirable layer for reducing dark current. In case where the dark current is not involved, the p+-type pinning layer 11b and p+-type pinning layer 12b may be omitted in view of the configuration.

An insulation film 2 is formed on the p+-type pinning layer 11b and p+-type pinning layer 12b, further on the semiconductor substrate that is between the p+-type pinning layer 11b and p+-type pinning layer 12b, and on the semiconductor substrate that is between the light receiving cathode region 11a and charge readout region 13. A silicon oxide film ($SiO_2$ film) is suitable for the insulation film 2, whereas it, instead, may be an insulation gate structure of an insulation gate transistor (MIS transistor) using various insulation films other than the silicon oxide film ($SiO_2$ film). For example, it may be an ONO film composed of a three-layered film of a silicon oxide film ($SiO_2$ film)/a silicon nitride film ($Si_3N_4$ film)/a silicon oxide film ($SiO_2$ film). Furthermore, the insulation film 2 can employ an oxide at least including any one element of strontium (Sr), aluminum (Al), magnesium (Mg), yttrium (Y), hafnium (Hf), zirconium (Zr), tantalum (Ta) and bismuth (Bi), or a silicon nitride including these elements, or the like.

On the insulation film 2, a transfer gate electrode 31 is disposed which controls potential of a first transfer channel formed between the light receiving cathode region 11a and charge accumulation region 12a, and transfers signal charge from the light receiving cathode region 11a to the charge accumulation region 12a, these included in first potential control means. Furthermore, on the insulation film 2, a readout gate electrode 32 is disposed which controls potential of a second transfer channel formed between the charge accumulation region 12a and charge readout region 13, and transfers the signal charge from the charge accumulation region 12a to the charge readout region 13, these included in second potential control means.

To the charge readout region 13, the gate electrode of a signal readout transistor (amplification transistor) MA1 included in a readout buffer amplifier 20 is connected. The drain electrode of the signal readout transistor (amplification transistor) MA1 is connected to a power supply VDD, and the source electrode thereof is connected to the drain electrode of a switching transistor MS1 for pixel selection.

The source electrode of the switching transistor MS1 for pixel selection is connected to a vertical signal line B1, and to the gate electrode thereof, a selection control signal S of a horizontal line is given. Setting the selection control signal S to the high ("H") level allows conduction through the switching transistor MS1, this further allowing current corresponding to the potential of the charge readout region 13 amplified by the signal readout transistor (amplification transistor) MA1 to flow through the vertical signal line B.

Moreover, to the charge readout region 13, the source electrode of a reset transistor TR included in the readout buffer amplifier 20 is connected. The drain electrode of the reset transistor TR is connected to the power supply VDD, and to the gate electrode thereof, a reset signal R is given. Setting the reset signal to the high ("H") level makes the signal charge accumulated in the light receiving cathode region 11a and charge accumulation region 12a discharge to reset the light receiving cathode region 11a and charge accumulation region 12a.

Incidentally, when accumulation time from readout of photocharge from the photodiode simultaneously for all the pixels to output thereof to a floating diffusion capacitance (FD) changes, the longer accumulation time causes a more increased amount of noise in which a smear component relative to a signal component is a primary component.

As illustrated in FIG. 1, the CMOS image sensor employing a global shutter is provided with the charge accumulation region 12a for each pixel. When the charge accumulation region 12a receives light, for example, from the subject with high luminance within the period of the charge being held, leakage of a signal from the surface-embedded region 11a for light receiving to the charge accumulation region 12a arises and causes noise. Moreover, at this stage, when the subject moves, noise with a trajectory shape on which the subject has moved (hereinafter referred to as trajectory-shaped noise) arises. The measurement P of the noise is defined by equation (1).

$$P = 20*LOG((M*Tm)/(H*Th)) \quad (1)$$

In equation (1), H and M denote output of the surface-embedded region 11a for light receiving and output of the charge accumulation region 12a per unit luminance per unit time, respectively. Moreover, Th and Tm denote an accumulation time (exposure time) of the surface-embedded region 11a for light receiving and a retention time of the charge accumulation region 12a.

Herein, it is known that M (output of the charge accumulation region 12a) in equation (1) has wavelength dependency and/or dependency on an incidence angle of incident light, and that the longer wavelength gives the larger amount thereof for the following reason.

Namely, the optical absorption coefficient of silicon is different depending on light wavelength, and therefore, the longer wavelength results in photoelectric conversion in the deeper portion. As a result, the longer wavelength tends to cause more photoelectric conversion at the portion other than the surface-embedded region 11a for light receiving.

Moreover, the longer light wavelength gives the larger diffraction angle, and as a result, light tends to permeate more in the charge accumulation region 12a.

Thus, since the longer wavelength gives the larger value of M in equation (1), the measurements P of the noise are typically larger in the descending order of R, G and B with respect to pixels, for example, in a Bayer arrangement.

Figure 2:
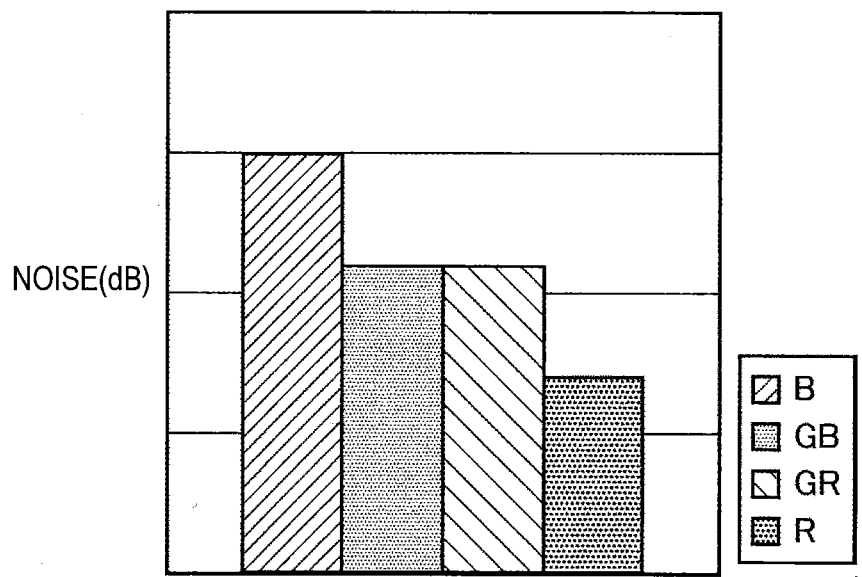
FIG. 2 is a diagram for explaining measurements of noise according to colors of pixels in the CMOS image sensor in the related art.

FIG. 2 is a diagram for explaining measurements of the noise according to colors of pixels in CMOS image sensors in the related art. In the example of the figure, the measurements of the noise are represented in a bar chart whose bars correspond to the respective colors of pixels. In addition, since the measurements of the noise are represented in dB, the higher bar indicates the smaller measurement of the noise. As illustrated in FIG. 2, the noise of the pixel of red (R) is the largest, followed by the measurement of the noise going smaller in the order of green (G) and blue (B).

In addition, GB in the figure means a green pixel arranged in the same row as that of a blue pixel in a pixel array in which pixels are arranged in a matrix shape, and GR in the figure means a green pixel arranged in the same row as that of a red pixel in the pixel array in which the pixels are arranged in a matrix shape.

Moreover, when N denotes the total row number of the pixels arranged in the pixel array and Tl denotes the retention time for the charge accumulation region 12a in the last row, a retention time Tm for the charge accumulation region 12a in the nth row is represented by equation (2).

$$Tm=Tl*(n/N) \quad (2)$$

As indicated in equation (2), the difference in retention time between the row first read out and the row last read out is large. Therefore, Th in equation (1) is also different depending on the row.

Figure 3:
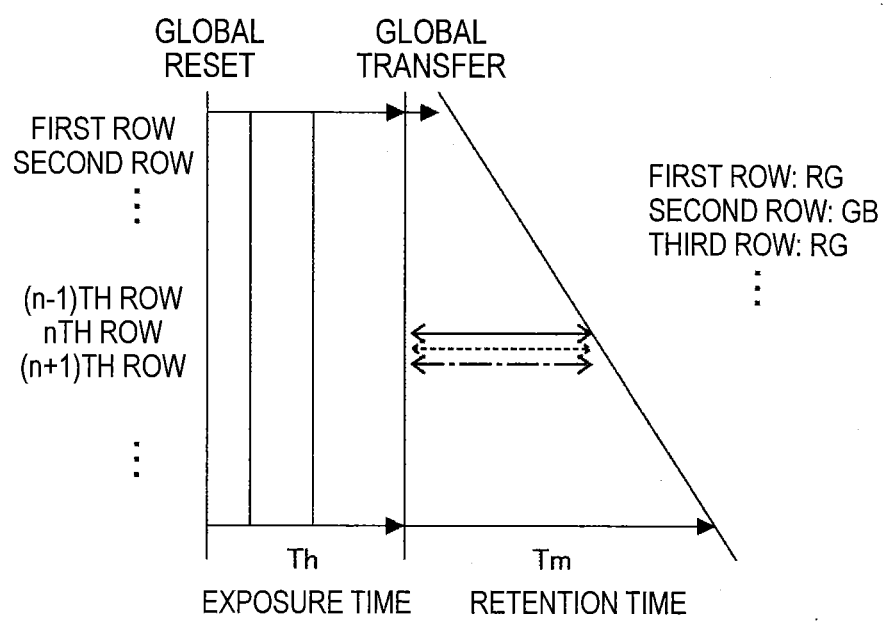
FIG. 3 is a diagram for explaining retention times of charge for pixels in individual rows in a pixel array in which the pixels are arranged in a matrix shape.

FIG. 3 is a diagram for explaining retention times of charge for the pixels in the individual rows in the pixel array in which the pixels are arranged in a matrix shape. In the figure, the horizontal axis denotes time, and the vertical axis denotes rows of pixels. As illustrated in FIG. 3, the retention time increases as the readout is performed later in the order of the first row, the second row, . . . .

Accordingly, it can be understood that, based on equation (1), the measurement of the noise becomes larger as the readout of the pixel is performed for the later row.

Thus, there are the problems regarding CMOS image sensors in the related art that measurements of the noise are different depending on colors of pixels, and further, that the measurements of the noise are different depending on the order of readout.

Hence, it is desirable to reduce the noise as small as possible and level it as long as possible and to reduce the influence of leakage of signals in an image sensor on the noise.

Figure 4:
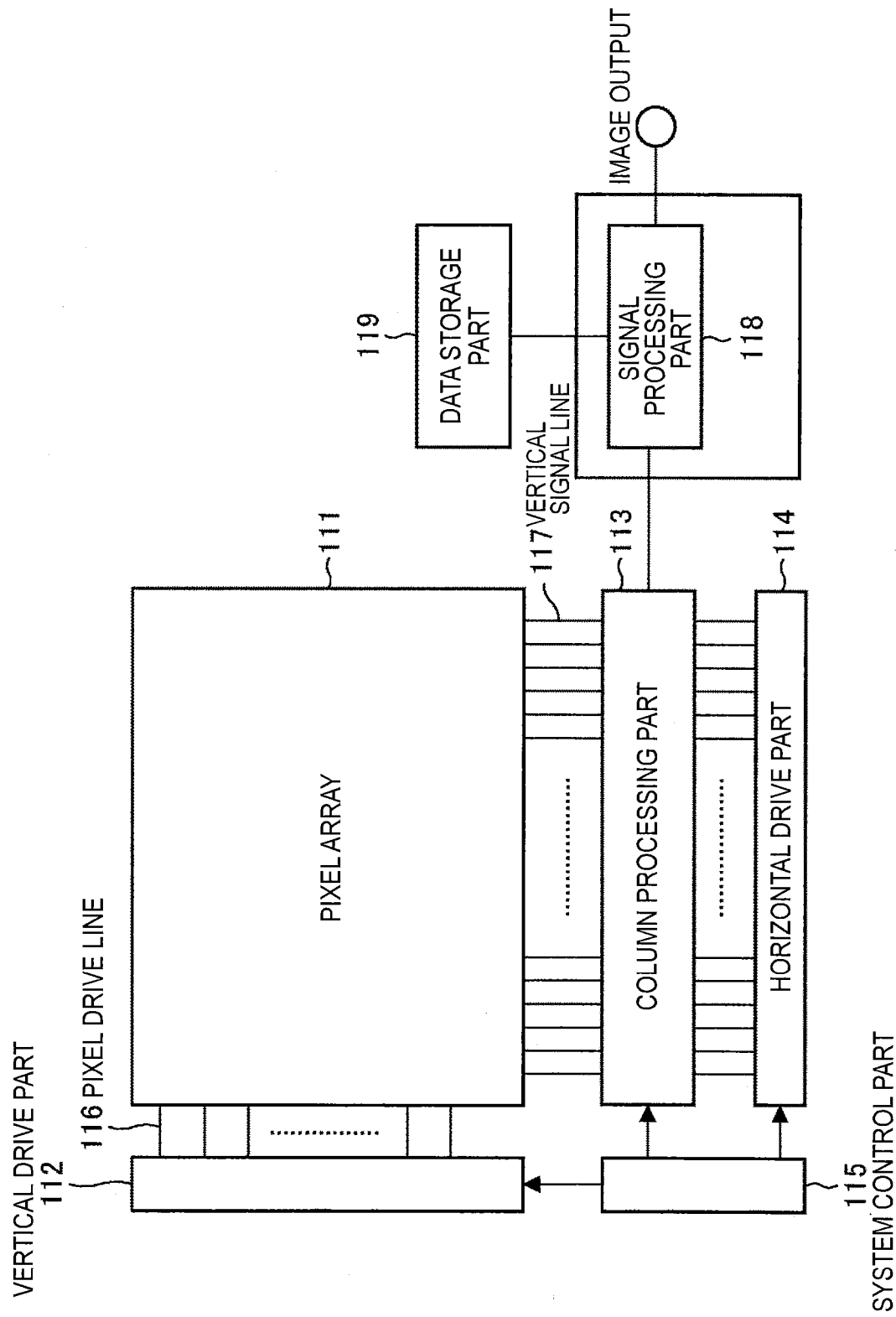
FIG. 4 is a block diagram illustrating an exemplary configuration of a solid-state imaging device to which the present technology is applied.

FIG. 4 is a block diagram illustrating an exemplary configuration of a solid-state imaging device to which the present technology is applied. A solid-state image sensor illustrated in the figure is configured as a CMOS image sensor, for example.

A CMOS image sensor 110 illustrated in FIG. 4 has a configuration including a pixel array 111 which is formed on a not-shown semiconductor substrate (chip), and peripheral circuits which are integrated on the same semiconductor substrate on which the relevant pixel array 111 is formed. The peripheral circuits includes a vertical drive part 112, a column processing part 113, a horizontal drive part 114 and a system control part 115, for example.

The CMOS image sensor 110 further includes a signal processing part 118 and a data storage part 119. The signal processing part 118 and the data storage part 119 may be configured of external signal processing parts such, for example, as DSPs (Digital Signal Processors), or the like. The external signal processing parts can also be realized with computer-based hardware such as the DSPs or CPU, and software for controlling these. The external signal processing parts are configured to include a memory in order to realize the data storage part 119. In addition, the external signal processing parts may be mounted on the same substrate on which the CMOS image sensor 110 is formed.

In the pixel array 111, unit pixels (hereinafter, sometimes referred to simply as "pixels") each having a photoelectric transducer generating photocharge (hereinafter, sometimes referred to as "signal charge" or simply as "charge") in a charge amount corresponding to an amount of incident light to accumulate it therein are two-dimensionally arranged in a matrix shape. The basic cross section and circuit configuration of the unit pixel may be either same as or partially different from that in FIG. 1.

In the pixel array 111, pixel drive lines 116 are formed in the horizontal direction in the figure (arrangement direction of pixels in pixel row) for each row with respect to the pixels arranged in a matrix shape, and vertical signal lines 117 are formed in the vertical direction in the figure for each column.

In addition, in FIG. 4, each pixel drive line 116 is indicated as one line for convenience, whereas it is not limited to one in reality. For example, this pixel drive line 116 includes a reset line applying a reset pulse RST to the gate of a reset transistor, and a selection line (scanning line) applying a selection pulse SEL to the gate of a selection transistor. Furthermore, the pixel drive line 116 also includes a trigger line supplying a trigger pulse which is applied along with the selection pulse in order to selectively read out signal voltages of pixels in the same row.

One end of the pixel drive line 116 is connected to an output terminal corresponding to each row of the vertical drive part 112.

The vertical drive part 112 is configured of a shift register, an address decoder and the like, and is a pixel drive part driving the individual pixels of the pixel array 111 simultaneously for a predetermined pixel region (in the embodiment, for all the pixels), or in row unit, or the like. This vertical drive part 112, the specific configuration of which is omitted in the figure, typically includes two scanning systems of a readout scanning system and a sweep scanning system. The readout scanning system and sweep scanning system are circuits independently driving the scanning line for each pixel row.

By sweep scanning due to the sweep scanning system, unrequired charges are swept out of the photoelectric transducers of the unit pixels in a read-out row (are reset). By this sweeping-out (resetting) of the unrequired charges due to the sweep scanning system, so-called electronic shutter operation is performed. Herein, the electronic shutter operation is an operation of discarding the photocharges of the photoelectric transducers (each corresponding to the photodiode 101 in FIG. 2) and newly starting exposure (starting accumulation photocharges).

A signal read out by readout operation due to the readout scanning system corresponds to the amount of light having been incident after the immediately preceding readout operation or electronic shutter operation. Then, a time period from readout timing or sweep timing due to the immediately preceding readout operation or electronic shutter operation to readout timing due to the current readout operation is an accumulation time (exposure time) of the photocharge in the unit pixel.

Signals outputted from individual unit pixels in pixel row having undergone selective scanning due to the vertical drive part 112 are supplied to the column processing part 113 through the respective vertical signal lines 117. The column processing part 113 performs predetermined signal processing on the signals outputted from the individual unit pixels in selected row through the vertical signal line 117 for the respective pixel columns of the pixel array 111, and in addition, temporarily holds the pixel signals after the signal processing.

Specifically, the column processing part 113 performs at least noise removing processing, for example, CDS (Correlated Double Sampling) processing as the signal processing. By this CDS processing due to the column processing part 113, fixed pattern noises intrinsic to pixels such as reset noise and scattering of thresholds of amplification transistors is removed. The column processing part 113 can be provided not only with the function of the noise removing processing but, for example, with an AD (analog-digital) conversion function, so as to output signal levels having undergone the conversion into digital signals.

The horizontal drive part 114 is configured of a shift register, an address decoder and the like, and selects unit circuits corresponding to individual pixel columns in the column processing part 113. By selective scanning due to this horizontal drive part 114, the pixel signals having undergone the signal processing in the column processing part 113 are sequentially outputted.

The system control part 115 is configured of a timing generator generating various timing signals, and the like, and performs drive controls on the vertical drive part 112, column processing part 113, horizontal drive part 114 and the like based on the various timing signals generated by the relevant timing generator.

The signal processing part 118 has at least an addition processing function, and performs various kinds of signal processing such as the addition processing on the pixel signals outputted from the column processing part 113. The addition processing aims, for example, to suppress random noise due to averaging, or the addition is sometimes performed for other purposes. The data storage part 119 temporarily stores data used for such processing as the signal processing in the signal processing part 118.

The column processing part 113 and horizontal drive part 114 are provided only on the lower side in the example of FIG. 4, whereas each set of the column processing parts 113 and horizontal drive parts 114 may be provided on each of both upper and lower sides, for example. Namely, the CMOS image sensor 110 may be driven in the so-called dual row readout method.

By driving the CMOS image sensor 110 in the dual row readout method, for example, signal voltages of red pixels and blue pixels can be outputted to the column processing part on the upper side, and signal voltages of green pixels can be outputted to the column processing part on the lower side. Consequently, two vertical signal lines 117 are provided for each single column of pixels in the case of the CMOS image sensor 110 driven in the dual row readout method.

In addition, regarding the manner of arrangement of pixels in the pixel array 111, Bayer arrangement is often employed typically. In the Bayer arrangement, a red pixel is disposed at the first row in the first column, a green pixel is disposed at the first row in the second column, a green pixel is disposed at the second row in the first column, and a blue pixel is disposed at the second row in the second column out of pixels in two rows by two columns. Namely, in the Bayer arrangement, one pixel group including the above-mentioned four pixels (red, green, green and blue in two rows by two columns) is substantially regarded as a unit pixel.

Also regarding the pixel array 111 illustrated in FIG. 4, it is supposed that the Bayer arrangement is employed and that one pixel group including the above-mentioned four pixels is substantially regarded as a unit pixel.

Figure 5:
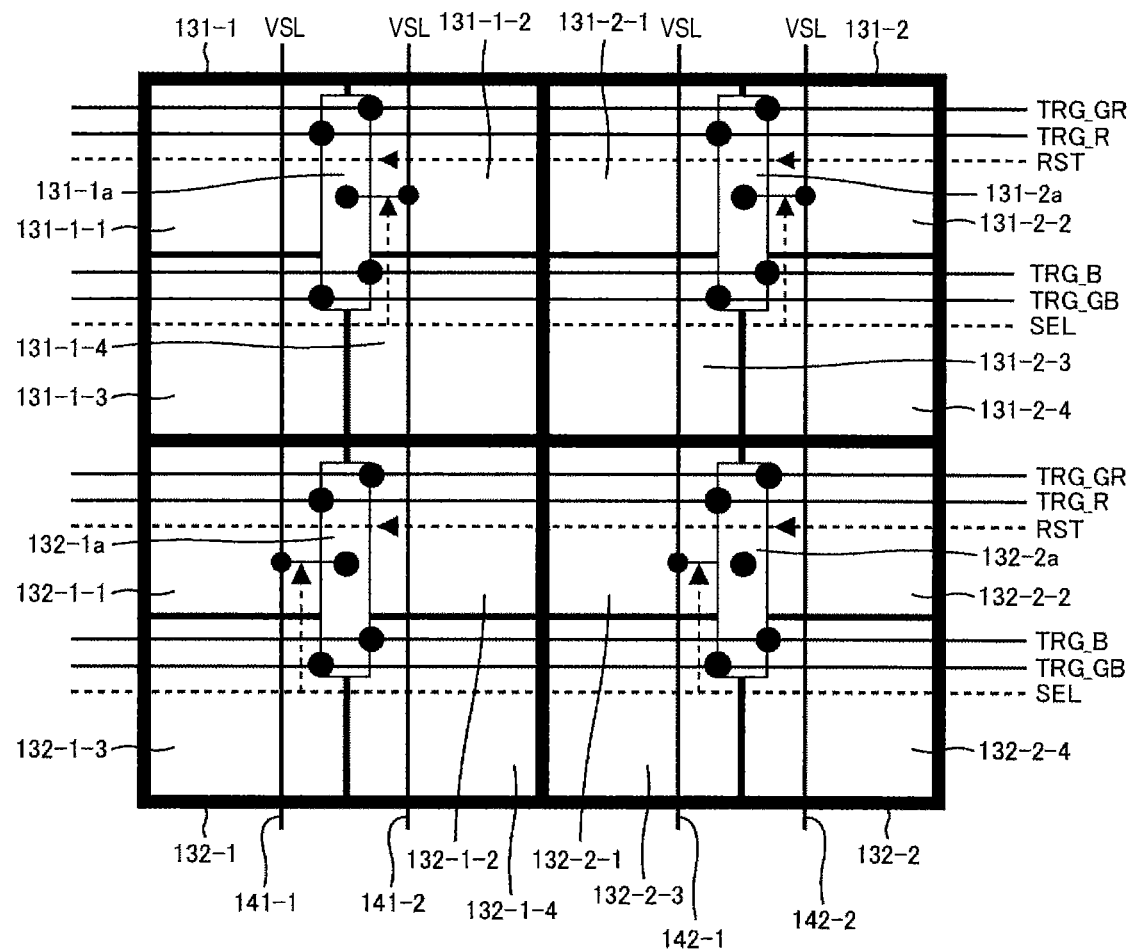
FIG. 5 is a diagram illustrating an arrangement example of pixels in a pixel array.

FIG. 5 is a diagram illustrating an arrangement example of pixels in the pixel array 111. Each of a pixel group 131-1, a pixel group 131-2, a pixel group 132-1 and a pixel group 132-2 illustrated in the figure is one pixel group including the above-mentioned four pixels, and is substantially regarded as a unit pixel. Namely, in that case where each pixel group is substantially regarded as a unit pixel, the pixel array in FIG. 5 includes the unit pixels arranged in two rows by two columns (each being a pixel group including four pixels in reality).

Herein, the arrangement of pixel groups in two rows by two columns for simplicity of the description, whereas the pixel array 111 includes more pixel groups in reality.

In addition, the example in the figure is an example in which the dual row readout method is employed for the CMOS image sensor 110 and in which a VSL (vertical signal line) 141-1 and a VSL 141-2 are provided in the first column of the pixel groups and a VSL 142-1 and a VSL 142-2 are provided in the second column of the pixel groups. Namely, each set of the column processing parts and horizontal drive parts is to be provided on each of both upper and lower sides in FIG. 5.

In the pixel group 131-1, a pixel 131-1-1 is to be a red pixel, a pixel 131-1-2 is to be a green pixel, a pixel 131-1-3 is to be a green pixel, and a pixel 131-1-4 is to be a blue pixel. A longitudinal rectangle 131-1a illustrated in the figure denotes floating diffusions of the pixel 131-1-1 to pixel 131-1-4 collectively for convenience.

Also for each of the pixel group 131-2, pixel group 132-1 and pixel group 132-2 similarly to the pixel group 131-1, a red pixel, green pixels and a blue pixel are arranged and floating diffusions of these four pixels are denoted collectively by one rectangle.

The floating diffusion 131-1a of the pixel group 131-1 is connected to the VSL 141-2, and the floating diffusion 132-1a of the pixel group 132-1 is connected to the VSL 141-1. Moreover, the floating diffusion 131-2a of the pixel group 131-2 is connected the VSL 142-2, and the floating diffusion 132-2a of the pixel group 132-2 is connected to the VSL 142-1.

Each pixel group in the Bayer arrangement has two green pixels, and one of them is disposed in the row same as that of a red pixel and the other is disposed in the row same as that of a blue pixel. A red pixel is denoted by R and a blue pixel B, and a green pixel in the same row as that for a red pixel is denoted by GR and a green pixel in the same row as that for a blue pixel GB in case where individual pixels are simply indicated.

Moreover, as illustrated in FIG. 5, each of the pixel group 131-1, pixel group 131-2, pixel group 132-1 and pixel group 132-2 is connected to a reset line RST and a selection line SEL indicated by the horizontal dotted lines in the figure. Furthermore, each of the pixel group 131-1, pixel group 131-2, pixel group 132-1 and pixel group 132-2 is connected to trigger lines TRG_GR, TRG_R, TRG_B and TRG_GB indicated by the solid lines in the figure.

The trigger line TRG_GR is a wiring for supplying a trigger pulse to the pixel of GR in each pixel group, and the trigger line TRG_R is a wiring for supplying a trigger pulse to the pixel of R in each pixel group. Moreover, the trigger line TRG_B is a wiring for supplying a trigger pulse to the pixel of B in each pixel group, and the trigger line TRG_GB is a wiring for supplying a trigger pulse to the pixel of GB in each pixel group.

For example, when a signal of the selection line SEL connected to the pixel group 131-1 and pixel group 131-2 is set to "H" and the trigger line TRG_GR is set to "H," signal voltages can be read out from the pixel 131-1-2 and pixel 131-2-2 via the VSL 141-2 and VSL 142-2. Moreover, for example, when the signal of the selection line SEL connected to the pixel group 131-1 and pixel group 131-2 is set to "H" and the trigger line TRG_R is set to "H," signal voltages can be read out from the pixel 131-1-1 and pixel 131-2-1 via the VSL 141-2 and VSL 142-2.

Furthermore, for example, when the signal of the selection line SEL connected to the pixel group 131-1 and pixel group 131-2 is set to "H" and the trigger line TRG_B is set to "H," signal voltages can be read out from the pixel 131-1-4 and pixel 131-2-4 via the VSL 141-2 and VSL 142-2. Moreover, for example, when the signal of the selection line SEL connected to the pixel group 131-1 and pixel group 131-2 is set to "H" and the trigger line TRG_GB is set to "H," signal voltages can be read out from the pixel 131-1-3 and pixel 131-2-3 via the VSL 141-2 and VSL 142-2.

Moreover, for example, when the signal of the selection line SEL connected to the pixel group 132-1 and pixel group 132-2 is set to "H" and the trigger line TRG_GR is set to "H," signal voltages can be read out from the pixel 132-1-2 and pixel 132-2-2 via the VSL 141-1 and VSL 142-1. Moreover, for example, when the signal of the selection line SEL connected to the pixel group 132-1 and pixel group 132-2 is set to "H" and the trigger line TRG_R is set to "H," signal voltages can be read out from the pixel 132-1-1 and pixel 132-2-1 via the VSL 141-1 and VSL 142-1.

Furthermore, for example, when the signal of the selection line SEL connected to the pixel group 132-1 and pixel group 132-2 is set to "H" and the trigger line TRG_B is set to "H," signal voltages can be read out from the pixel 132-1-4 and pixel 132-2-4 via the VSL 141-1 and VSL 142-1. Moreover, for example, when the signal of the selection line SEL connected to the pixel group 132-1 and pixel group 132-2 is set to "H" and the trigger line TRG_GB is set to "H," signal voltages can be read out from the pixel 132-1-3 and pixel 132-2-3 via the VSL 141-1 and VSL 142-1.

In addition, a signal voltage read out from a pixel of R or a pixel of B is to undergo AD conversion by the upper column processing part in FIG. 5, and a signal voltage read out from a pixel of GR or a pixel of GB is to undergo AD conversion by the lower column processing part in FIG. 5.

In the present technology, at first, the upper selection line SEL in the figure is set to "H" and the trigger line TRG_R is set to "H," and thereby the signal voltages are read out from the pixel 131-1-1 and pixel 131-2-1 via the VSL 141-2 and VSL 142-2 into the upper column processing part in the figure. After that, furthermore, the lower selection line SEL in the figure is set to "H" and the trigger line TRG_R is set to "H," and thereby the signal voltages are read out from the pixel 132-1-1 and pixel 132-2-1 via the VSL 141-1 and VSL 142-1 into the upper column processing part in the figure. Thus, at first, the signal voltages are read out from all the pixels of R. This is to be referred to, for example, as a first step.

In the present technology, next, the upper selection line SEL in the figure is set to "H" and the trigger line TRG_GR is set to "H," and thereby the signal voltages are read out from the pixel 131-1-2 and pixel 131-2-2 via the VSL 141-2 and VSL 142-2 into the lower column processing part in the figure. After that, furthermore, the lower selection line SEL in the figure is set to "H" and the trigger line TRG_GR is set to "H," and thereby the signal voltages are read out from the pixel 132-1-2 and pixel 132-2-2 via the VSL 141-1 and VSL 142-1 into the lower column processing part in the figure. Thus, the signal voltages are read out from all the pixels of GR. This is to be referred to, for example, as a second step.

In the present technology, next, the upper selection line SEL in the figure is set to "H" and the trigger line TRG_GB is set to "H," and thereby the signal voltages are read out from the pixel 131-1-3 and pixel 131-2-3 via the VSL 141-2 and VSL 142-2 into the lower column processing part in the figure. After that, furthermore, the lower selection line SEL in the figure is set to "H" and the trigger line TRG_GB is set to "H," and thereby the signal voltages are read out from the pixel 132-1-3 and pixel 132-2-3 via the VSL 141-1 and VSL 142-1 into the lower column processing part in the figure. Thus, the signal voltages are read out from all the pixels of GB. This is to be referred to, for example, as a third step.

In the present technology, next, the upper selection line SEL in the figure is set to "H" and the trigger line TRG_B is set to "H," and thereby the signal voltages are read out from the pixel 131-1-4 and pixel 131-2-4 via the VSL 141-2 and VSL 142-2 into the upper column processing part in the figure. After that, furthermore, the lower selection line SEL in the figure is set to "H" and the trigger line TRG_B is set to "H," and thereby the signal voltages are read out from the pixel 132-1-4 and pixel 132-2-4 via the VSL 141-1 and VSL 142-1 into the upper column processing part in the figure. Thus, the signal voltages are read out from all the pixels of B. This is to be referred to, for example, as a fourth step.

Figure 6:
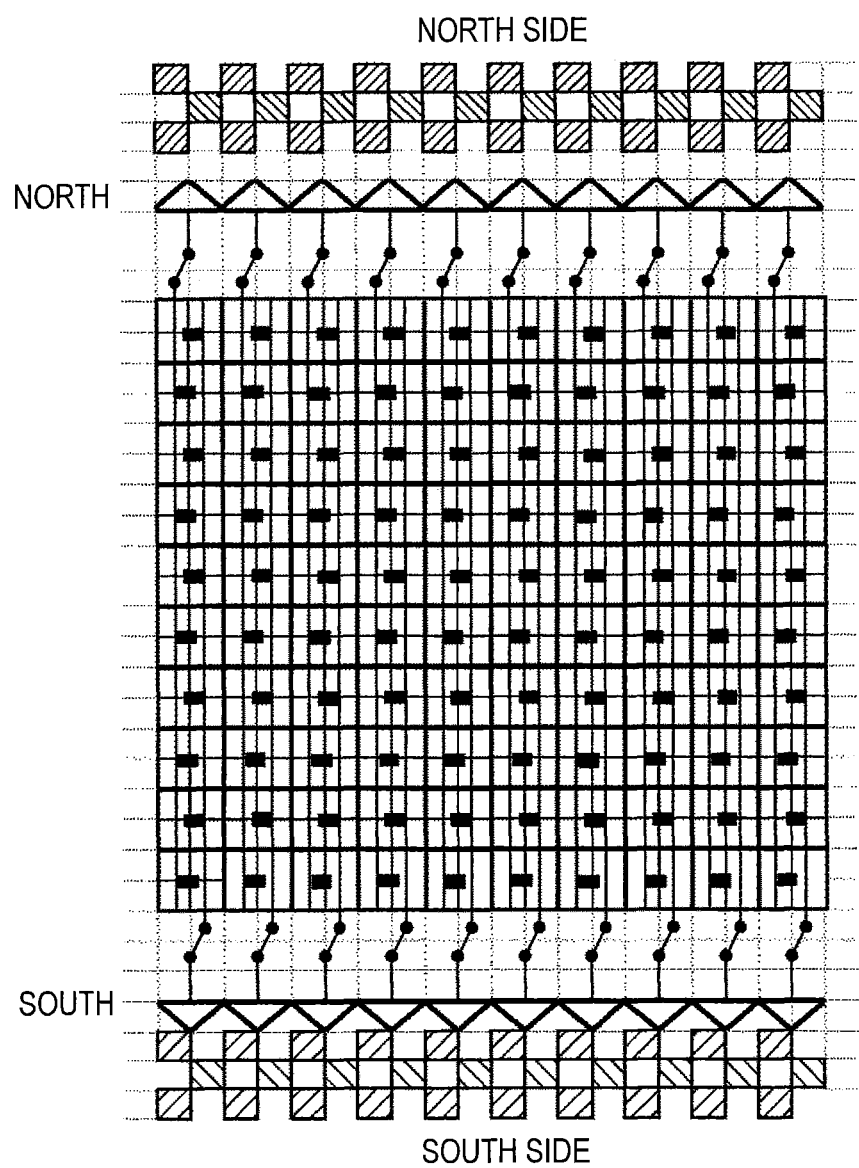
FIG. 6 is a diagram for explaining an example of generation of pixel signals in a dual row readout method.

Performing the first step to fourth step generates pixel signals of the pixels of R and pixel signals of the pixels of B using the upper column processing part in the figure and pixel signals of the pixels of GR and pixel signals of the pixels of GB using the lower column processing part in the figure, for example, as illustrated in FIG. 6. For example, the pixel signals for each color generated from the signal voltages of the pixels for each color read out for each row are stored in the data storage part 119 via the signal processing part 118, associated with information representing positions of the individual pixels. Then, the signal processing part 118 generates image data by sorting the pixel signals stored in the data storage part 119.

By doing so, in the present technology, signal voltages can be read out from pixels sequentially in the decreasing order of ease of noise accumulation.

In addition, the first step to fourth step are realized by controlling drive of the vertical drive part 112, column processing part 113 and horizontal drive part 114 according to the timing signals generated by the timing generator and the like of the system control part 115 in FIG. 4. Namely, the system control part 115 is configured to generate the timing signals for enabling readout of the signal voltages in the first step to fourth step.

In the example of FIG. 5, the description is made, supposing that the CMOS image sensor 110 employs the dual row readout method, whereas the dual row readout method is not necessarily expected to be employed in the present technology. In case where the CMOS image sensor 110 does not employ the dual row readout method, just one vertical signal line is provided for each column of pixels. For example, in FIG. 5, the VSL 141-2 and VSL 142-2 are not provided and only the VSL 141-1 and VSL 142-1 are provided.

In the case where the CMOS image sensor 110 does not employ the dual row readout method, the signal voltages of the pixels of each of R, GR, GB and B in the first step to fourth step are to be read out via the VSL 141-1 and VSL 142-1 into the lower column processing part in the figure.

Figure 7:
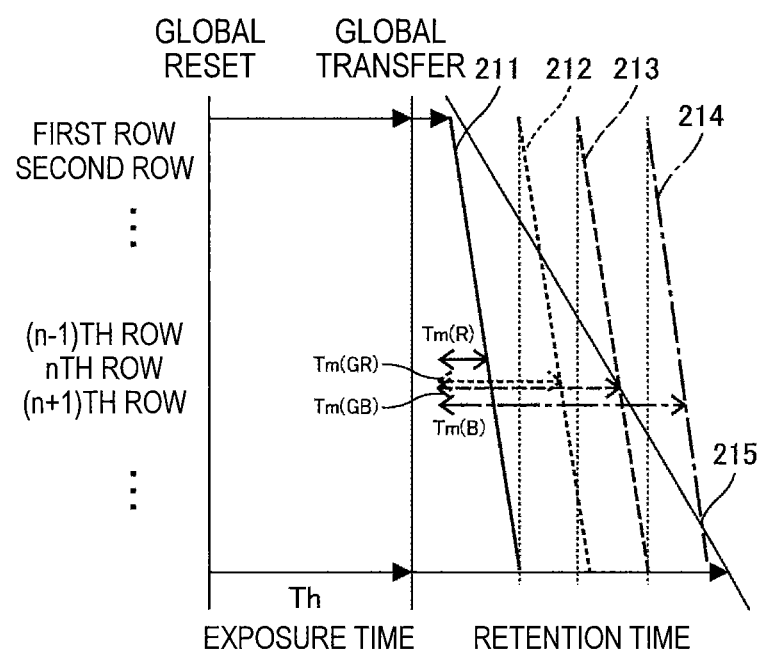
FIG. 7 is a diagram for explaining retention times for individual pixels in case where the present technology is applied.

FIG. 7 is a diagram for explaining retention times for the individual pixels in case where the present technology is applied. In FIG. 7, similarly to FIG. 3, the horizontal axis denotes time and the vertical axis denotes rows of pixels. Moreover, FIG. 7 illustrates a line 211 indicating a retention time for the pixel of R, a line 212 indicating a retention time for the pixel of GR, a line 213 indicating a retention time for the pixel of GB, and a line 214 indicating a retention time for the pixel of B. Furthermore, FIG. 7 illustrates a line 215 indicating a retention time for each pixel in the related art for reference.

For example, Tm denotes the retention time indicated by the line 215, and Tl denotes the retention time for the last row. Furthermore, Tm(R) denotes the retention time indicated by the line 211, Tm(GR) denotes the retention time indicated by the line 212, Tm(GB) denotes the retention time indicated by the line 213, and Tm(B) denotes the retention time indicated by the line 214. When N denotes the total row number of the pixels arranged in the pixel array, the respective retention times in the nth row can be represented by equation (3) to equation (6).

$$Tm(R) = \tfrac{1}{4}Tm = \tfrac{1}{4} * Tl * (n/N) \tag{3}$$

$$Tm(GR) = \tfrac{1}{4}Tl + \tfrac{1}{4}Tm = \tfrac{1}{4}*(1+N/n)Tm \tag{4}$$

$$Tm(GB)=\tfrac{3}{4}Tl+\tfrac{1}{4}Tm=\tfrac{1}{4}*(2+N/n)Tm \quad (5)$$

$$Tm(B)=\tfrac{3}{4}Tl+\tfrac{1}{4}Tm=\tfrac{1}{4}*(3+N/n)Tm. \quad (6)$$

According to equation (3), Tm(R) indicates that the retention time can be shortened over the entirety of the rows in the pixel array 111. Hence, noise included in the signal voltages outputted from the pixels of R can be reduced over the entirety of the rows.

According to equation (4), Tm(GR) indicates that the retention time can be shortened in the rows where n>N/3. Hence, noise included in the signal voltages outputted from the pixels of GR in the rows where n>N/3 can be reduced over the entirety of the rows.

According to equation (5), Tm(GB) indicates that the retention time increases in the rows where n>N/2. According to equation (6), Tm(B) indicates that the retention time increases over the entirety of the rows. Therefore, noise included outputted from the pixels of B is not expected to be reduced so much.

However, application of the present technology enables to reduce the retention time of the pixels of R, in which the noise contaminates most easily, over the entirety of the rows, and therefore noise over the entire image can be reduced.

Furthermore, application of the present technology enables to reduce the difference between retention times in the first row and the nth row for pixels for all the colors down to ¼Tm, while it is Tm in the related art, this leading to leveling of the noise amount, and thereby, generation of the natural image causing less uncomfortable feeling.

Figure 8:
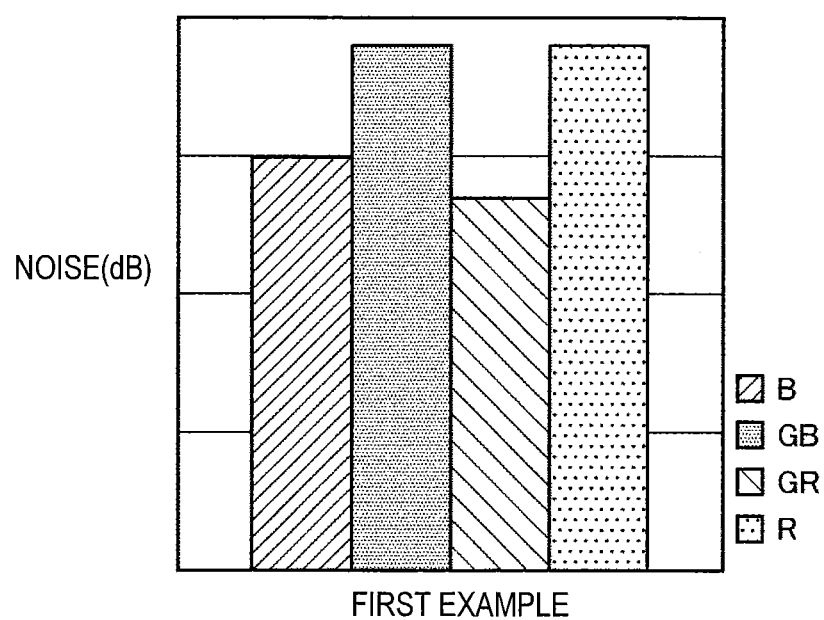
FIG. 8 is a diagram for explaining measurements of noise according to colors of pixels in a CMOS image sensor to which the present technology is applied.

FIG. 8 is a diagram for explaining measurements of the noise according to colors of pixels in the CMOS image sensor to which the present technology is applied. In the figure, the measurements of the noise observed corresponding to the retention times illustrated in FIG. 7 are represented in a bar chart whose bars correspond to the respective colors of pixels. In addition, similarly to the illustration in FIG. 2, since the measurements of the noise are represented in dB, the higher bar indicates the smaller measurement of the noise. Moreover, the scale of the vertical axis in the graph of FIG. 8 is same as that of FIG. 2.

As illustrated in FIG. 8, the noise of the pixel of GR is the largest, followed by the measurement of the noise going smaller in the order of B, GB and R. Moreover, compared with FIG. 2, FIG. 8 presents the smaller measurement of the noise for the pixels of all the colors except the pixel of B. Thus, application of the present technology enables to reduce a feeling of noise over the entirety of the image.

Incidentally, as above, the example in which, after the upper selection line SEL in the figure is set to "H," the lower selection line SEL in the figure is set to "H" in each of the first step to fourth step has been described.

However, for example, the upper selection line SEL in the figure and the lower selection line SEL in the figure may be simultaneously set to "H" in each of the first step to fourth step. In this case, it is suitable that, at first, the signal voltages are read out via the VSL 141-2 and VSL 142-2, and after that, the signal voltages are read out via the VSL 141-1 and VSL 142-1. Namely, the row of the pixels to be read out may be selected by switching the vertical signal lines (VSLs) through which the signal voltages are read out in place of selection of the rows of the pixels to be read out using the pulses of the selection lines SEL.

Furthermore, as above, an example of reading out the pixels of each color row by row has been described. For example, the example in which, after the pixel 131-1-1 and pixel 131-2-1 are read out, the pixel 132-1-1 and pixel 132-2-1 are read out for the pixels of R has been described.

However, for example, the pixels of each color may be read out simultaneously for every two rows. For example, the pixel 131-1-1, pixel 131-2-1, pixel 132-1-1 and pixel 132-2-1 may be read out simultaneously for the pixels of R.

In this case, for example, in the first step, the upper selection line SEL in the figure and the lower selection line SEL in the figure are simultaneously set to "H" and the trigger line TRG_R is set to "H." Then, the signal voltages are read out via the VSL 141-2 and VSL 142-2 into the upper column processing part in the figure, and simultaneously, the signal voltages are read out via the VSL 141-1 and VSL 142-1 into the lower column processing part in the figure.

By doing so, the signal voltages of the pixels of R can be read out simultaneously for two rows. Herein, the pixels of R are exemplarily described, whereas the readout simultaneously for two rows can be performed also similarly for the pixels of GR, pixels of GB or pixels of B.

In addition, in this case, differently from the example described with reference to FIG. 6, the upper column processing part in the figure is to generate the pixel signals of one part of the pixels, and the lower column processing part in the figure is to generate the pixel signals of the other part of the pixels out of the pixels of each color. Namely, in case of reading out the pixels of each color simultaneously for two rows, each of the upper column processing part in the figure and the lower column processing part in the figure generates the individual pixel signals of R, GR, GB and B.

Then, the pixel signals for each color are stored in the data storage part 119 via the signal processing part 118, associated with information representing positions of the individual pixels. The signal processing part 118 generates image data by sorting the pixel signals stored in the data storage part 119.

As above, an example in which the pixels of each color are sequentially from the top row by row (for each row are simultaneously for every two rows) has been described, whereas the readout of the pixels may be performed from the row located at the center of the pixel array 111, for example.

Figure 9:
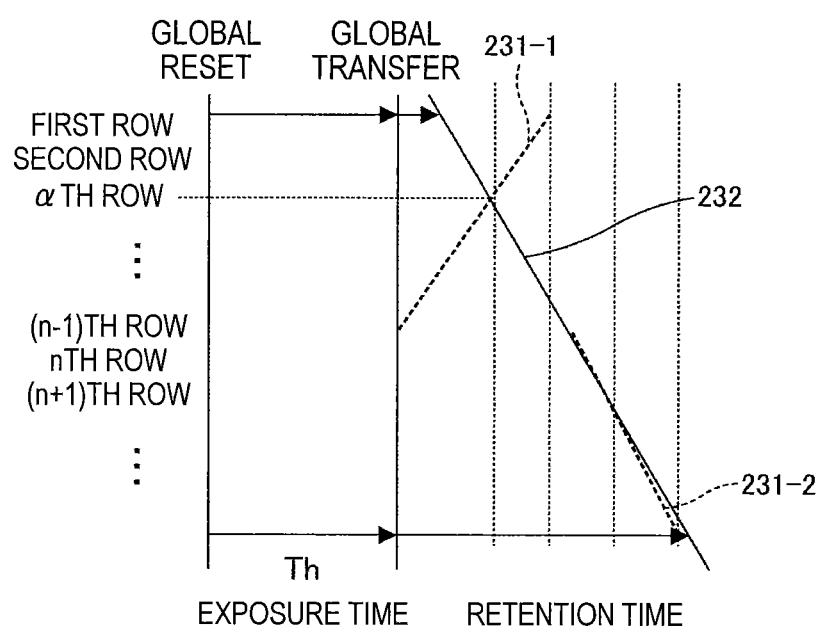
FIG. 9 is a diagram for explaining an example of retention times for individual pixels in case of reading out the pixels from the row located at the center.

FIG. 9 is a diagram for explaining an example of retention times for the individual pixels in case of reading out the pixels from the row located at the center of the pixel array 111. In FIG. 9, similarly to FIG. 3, the horizontal axis denotes time and the vertical axis denotes rows of pixels. Moreover, FIG. 9 illustrates a line 231-1 and a line 231-2 indicating retention times for each pixel, and a line 232 indicating a retention time for each pixel in the case of performing the readout from the top row for reference.

Namely, in FIG. 9, the readout is started from the pixels in the nth row which locates at the center of the pixel array 111. Then, the pixels for each row, the (n−1)th row, (n−2)th row, ..., first row, are being read out sequentially upward of the pixel array 111 (line 231-1). Moreover, in FIG. 9, after the end of the readout of the pixels in the first row, the pixels for each row, the (n+1)th row, (n+2)th row, (n+3)th row, ..., are being readout sequentially downward of the pixel array 111 (line 231-2).

By doing so, compared with the readout sequentially from the upper rows, the retention time, for example, for the pixels in the ath row to nth row can be reduced. Namely, noise of center upper pixels which tend to be more noticed relatively within the screen can be reduced.

The line 231-1 and line 231-2 illustrated in FIG. 9 indicates retention times in case of readout without discrimination of pixels for individual colors, whereas, regarding a retention time of the pixels for each color, the characteristics same as the characteristics indicated in the line 231-1 and line 231-2 are expected to be observed even in the case of the readout of the pixels sequentially in the order of the individual colors, R, GR, GB and B, for example.

Accordingly, also in the case of the readout of the pixels in the order of the individual colors, R, GR, GB and B, the readout of the pixels for each color from the row located at the center of the pixel array 111 enables to reduce the retention time of the pixels for each color on the center upper portion of the screen. Namely, noise of pixels disposed in the portion which tends to be more noticed relatively within the screen can be reduced.

In addition, the present technology is not limitedly applied to solid-state image sensors such as a CMOS image sensor. Namely, the present technology can be applied to a general electronic apparatus using a solid-state image sensor in an image intake part (photoelectric conversion part), which equipment is such as image capturing devices such as a digital still camera and a video camera, mobile terminal devices having an image capturing function, and copying machines using a solid-state image sensor in an image readout part. The solid-state image sensor may be fabricated in a one-chip form, or may be fabricated in a module form having an image capturing function in which an image capturing part and a signal processing part or an optical system are collectively packaged.

Figure 10:
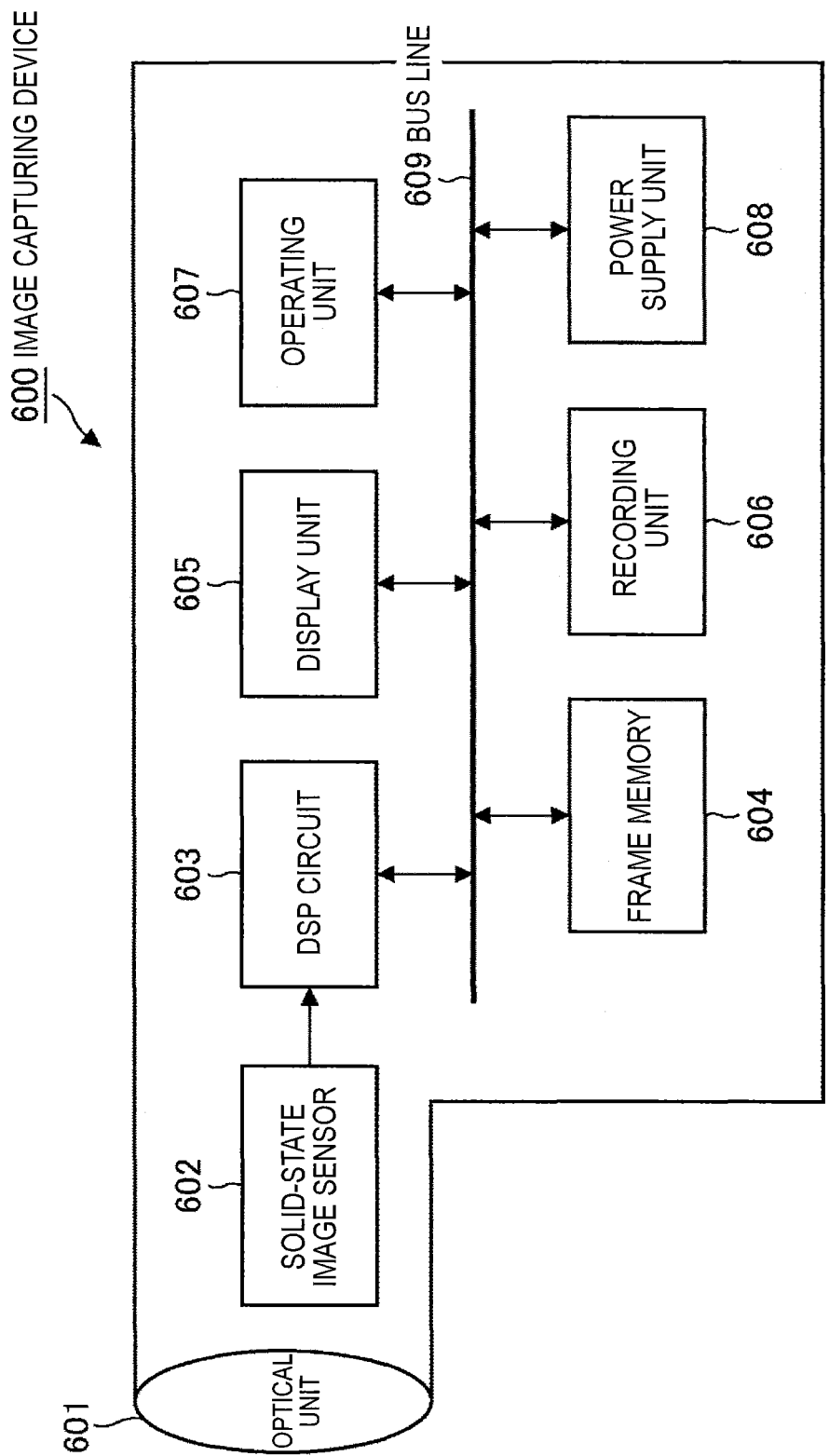
FIG. 10 is a block diagram illustrating an exemplary configuration of an image capturing device.

FIG. 10 is a block diagram illustrating an exemplary configuration of an image capturing device as an electronic apparatus to which the present technology is applied.

The image capturing device 600 in FIG. 10 includes an optical unit 601 having a lens group or the like, a solid-state image sensor (image capturing device) 602 for which each configuration of the above-mentioned pixel is employed, and a DSP circuit 603 which is a camera signal processing circuit. Moreover, the image capturing device 600 also includes a frame memory 604, a display unit 605, a recording unit 606, an operating unit 607 and a power supply unit 608. The DSP circuit 603, frame memory 604, display unit 605, recording unit 606, operating unit 607 and power supply unit 608 are connected to one another via a bus line 609.

The optical unit 601 picks up incident light (image light) coming from a subject, and forms an image on an imaging plane of the solid-state image sensor 602. The solid-state image sensor 602 converts the amounts of incident light formed into the image on the imaging plane due to the optical unit 601 into an electrical signal on a pixel basis, and outputs it as an image signal. As this solid-state image sensor 602, there can be used a solid-state image sensor such as the CMOS image sensor 110 according to the above-mentioned embodiment, that is, a solid-state image sensor which can realize distortion-free image capturing through global exposure.

The display unit 605 has a panel-type display such, for example, as a liquid crystal panel and an organic EL (electroluminescent) panel, and displays a motion picture or still image picked up by the solid-state image sensor 602. The recording unit 606 records the motion picture or still image, captured by the solid-state image sensor 602, on a recording medium such as a video tape and a DVD (Digital Versatile Disk).

The operating unit 607, under user's operations, issues operation commands relating to the various functions possessed by the image capturing device 600. The power supply unit 608 appropriately supplies various kinds of electric power to the DSP circuit 603, frame memory 604, display unit 605, recording unit 606 and operating unit 607 as power for operations of these.

As mentioned above, use of the CMOS image sensor 110 according to the above-mentioned embodiment as the solid-state image sensor 602 enables to accurately remove reset noise without addition of signals both in extracting the first pixel signal and in extracting the second pixel signal. Therefore, image quality of captured images can be enhanced in such image capturing devices 600 as video cameras, digital still cameras, and camera modules for use in mobile apparatuses such as mobile phones.

Moreover, the above embodiments have been described by taking, as an example, application to the CMOS image sensor in which unit pixels for detecting signal charges according to the amounts of visible light as physical quantity are arranged in a matrix shape. However, the present technology is not limitedly applied to the CMOS image sensor, but can be applied to general solid-state image sensors in a column type in which column processing parts are arranged for individual pixel columns in a pixel array.

In addition, the application of the present technology is not restricted to the application to a solid-state image sensor for imaging through detection of distribution of the amount of incident visible light, but is possible to solid-state image sensors for imaging through detection of distribution of the incident amounts of infrared (IR) rays, X-rays, particles or the like, and to general solid-state image sensors (physical quantity distribution detectors) in wide meaning which perform imaging through detection of distribution of other physical quantity such as pressure and capacitance, for example, a fingerprint sensor.

In addition, the series of processes mentioned above in the present specification include processes performed chronologically in the described order, of course, and also includes processes performed in parallel or individually, not necessarily performed chronologically.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A solid-state image sensor including:

a pixel region in which a plurality of pixels of a preset plurality of colors are arranged in a two-dimensional matrix shape;

a vertical signal line corresponding to a pixel column of the pixel region;

a trigger line corresponding to a pixel row of the pixel region and supplying a trigger pulse corresponding to each of the colors of the plurality of pixels; and a trigger pulse supply part supplying, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

(2) The solid-state image sensor according to (1), wherein the predetermined color is determined based on noise characteristics defined according to the colors of the plurality of pixels.

(3) The solid-state image sensor according to (1) or (2), wherein the trigger pulse supply part supplies, via the trigger line, the trigger pulse in a manner that each signal voltage of a red pixel in the pixel region is read out for each pixel row via the vertical signal line, thereafter, each signal voltage of a green pixel in the pixel region is read out for each pixel row via the vertical signal line, and thereafter, each signal voltage of a blue pixel in the pixel region is read out for each pixel row via the vertical signal line.

(4) The solid-state image sensor according to any one of (1) to (3), further including:
a data conversion part converting the read-out signal voltage into digital data,
wherein a plurality of the vertical signal lines correspond to the pixel column of the pixel region, and another data conversion part is supplied with each signal voltage read out via the respective plurality of vertical signal lines.

(5) The solid-state image sensor according to (4),
wherein the trigger pulse supply part supplies, via the trigger line, the trigger pulse in a manner that each signal voltage of the pixel of the predetermined color in the pixel region is read out for every two rows in respect to the pixel row via the vertical signal line, and thereafter, each signal voltage of the pixel of the other color in the pixel region is read out for every two rows in respect to the pixel row via the vertical signal line.

(6) The solid-state image sensor according to any one of (1) to (5),
wherein the trigger pulse supply part supplies, via the trigger line, the trigger pulse in a manner that each signal voltage of the pixel of the predetermined color in the pixel region is read out for each pixel row via the vertical signal line in order from a pixel row located at a center of the pixel region, and thereafter, each signal voltage of the pixel of the other color in the pixel region is read out for each pixel row via the vertical signal line in order from the pixel row located at the center of the pixel region.

(7) A driving method including:
providing
a pixel region in which a plurality of pixels of a present plurality of colors are arranged in a two-dimensional matrix shape,
a vertical signal line corresponding to a pixel column of the pixel region, and
a trigger line corresponding to a pixel row of the pixel region and supplying a trigger pulse corresponding to each of the colors of the plurality of pixels; and
supplying, by a trigger pulse supply part, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

(8) An electronic apparatus including:
a solid-state image sensor including
a pixel region in which a plurality of pixels of a present plurality of colors are arranged in a two-dimensional matrix shape,
a vertical signal line corresponding to a pixel column of the pixel region,
a trigger line corresponding to a pixel row of the pixel region and supplying a trigger pulse corresponding to each of the colors of the pixels, and
a trigger pulse supply part supplying, via the trigger line, the trigger pulse in a manner that a signal voltage of each pixel of a predetermined color in the pixel region is read out for each pixel row via the vertical signal line, and thereafter, a signal voltage of each pixel of another color in the pixel region is read out for each pixel row via the vertical signal line.

The present disclosure contains subject matter related to that disclosed in Japanese Priority Patent Application JP 2012-079578 filed in the Japan Patent Office on Mar. 30, 2012, the entire content of which is hereby incorporated by reference.

What is claimed is:
1. A solid-state image sensor comprising:
a matrix of pixels;
a vertical signal line configured to receive a first electrical signal from a first one of the pixels, a second electrical signal from a second one of the pixels, a third electrical signal from a third one of the pixels, and a fourth electrical signal from a fourth one of the pixels;
a different vertical signal line configured to receive a fifth electrical signal from a fifth one of the pixels, a sixth electrical signal from a sixth one of the pixels, a seventh electrical signal from a seventh one of the pixels, and an eighth electrical signal from an eighth one of the pixels;
vertical drive part that outputs selection pulses and trigger pulses to the matrix of the pixels, the third one of the pixels is between the first one of the pixels and the fifth one of the pixels,
wherein the matrix of the pixels is configured to output the first electrical signal onto the vertical signal line when a first one of the selection pulses is at a scanning level along with a first one of the trigger pulses being at a triggering level, the first one of the trigger pulses is at the triggering level before a second one of the trigger pulses is at the triggering level, and
wherein the matrix of the pixels is configured to output the fifth electrical signal onto the different vertical signal line when the second one of the trigger pulses is at the triggering level along with a second one of the selection pulses being at the scanning level, the second one of the selection pulses is at the scanning level after the first one of the selection pulses is at the scanning level,
wherein the matrix of the pixels is configured to output the second electrical signal onto the vertical signal line when a third one of the selection pulses is at the scanning level along with a third one of the trigger pulses being at the triggering level, the second one of the trigger pulses is at the triggering level before the third one of the trigger pulses is at the triggering level with the second one of the selection pulses being at the scanning level before the third one of the selection pulses is at the scanning level,
wherein the matrix of the pixels is configured to output the sixth electrical signal onto the different vertical signal line when a fourth one of the selection pulses is at the scanning level along with a fourth one of the trigger pulses being at the triggering level, the third one of the trigger pulses is at the triggering level before the fourth one of the trigger pulses is at the triggering level with the third one of the selection pulses being at the scanning level before the fourth one of the selection pulses is at the scanning level, and
wherein the matrix of the pixels is configured to output the third electrical signal onto the vertical signal line when a fifth one of the selection pulses is at the scanning level along with a fifth one of the trigger pulses being at the triggering level the fourth one of the trigger pulses is at the triggering level before the fifth one of the trigger pulses is at the triggering level with the fourth one of the selection pulses being at the scanning level before the fifth one of the selection pulses is at the scanning level.

2. The solid-state image sensor according to claim 1, wherein the fourth one of the pixels is between the second one of the pixels and the sixth one of the pixels.

3. The solid-state image sensor according to claim 1, wherein the matrix of the pixels is configured to output the seventh electrical signal onto the different vertical signal line when a sixth one of the selection pulses is at the scanning level along with a sixth one of the trigger pulses being at the triggering level, the fifth one of the trigger pulses is at the triggering level before the sixth one of the trigger pulses is at the triggering level with the fifth one of the selection pulses being at the scanning level before the sixth one of the selection pulses is at the scanning level.

4. The solid-state image sensor according to claim 3, wherein the matrix of the pixels is configured to output the fourth electrical signal onto the vertical signal line when a seventh one of the selection pulses is at the scanning level along with a seventh one of the trigger pulses being at the triggering level, the sixth one of the trigger pulses is at the triggering level before the seventh one of the trigger pulses is at the triggering level with the sixth one of the selection pulses being at the scanning level before the seventh one of the selection pulses is at the scanning level.

5. The solid-state image sensor according to claim 4, wherein the fifth one of the pixels is between the third one of the pixels and the seventh one of the pixels.

6. The solid-state image sensor according to claim 4, wherein the matrix of the pixels is configured to output the eighth electrical signal onto the different vertical signal line when an eighth one of the selection pulses is at the scanning level along with an eighth one of the trigger pulses being at the triggering level, the seventh one of the trigger pulses is at the triggering level before the eighth one of the trigger pulses is at the triggering level with the seventh one of the selection pulses being at the scanning level before the eighth one of the selection pulses is at the scanning level.

7. The solid-state image sensor according to claim 6, wherein the sixth one of the pixels is between the fourth one of the pixels and the eighth one of the pixels.

8. The solid-state image sensor according to claim 1, wherein the first one of the pixels is configured to convert a first wavelength of light into the first electrical signal, the fifth one of the pixels is configured to the first wavelength of the light into the fifth electrical signal.

9. The solid-state image sensor according to claim 8, wherein the second one of the pixels is configured to convert a second wavelength of the light into the second electrical signal, the sixth one of the pixels is configured to the second wavelength of the light into the sixth electrical signal.

10. The solid-state image sensor according to claim 9, wherein the third one of the pixels is configured to convert the second wavelength of the light into the third electrical signal, the seventh one of the pixels is configured to the second wavelength of the light into the seventh electrical signal.

11. The solid-state image sensor according to claim 9, wherein the fourth one of the pixels is configured to convert a third wavelength of the light into the fourth electrical signal, the eighth one of the pixels is configured to the third wavelength of the light into the eighth electrical signal.

12. An electronic apparatus comprising:
the solid-state image sensor according to claim 8; and
an optical unit configured to receive the light from a subject, the optical unit is configured to form an image of the subject on an imaging plane of the solid-state image sensor.

13. A method of driving a matrix of pixels, the method comprising:
supplying a first electrical signal from a first one of the pixels to a vertical signal line, the first one of the pixels converting a first wavelength of light into the first electrical signal;
supplying a second electrical signal from a second one of the pixels to the vertical signal line, the second one of the pixels converting a second wavelength of light into the second electrical signal;
supplying a third electrical signal from a third one of the pixels to the vertical signal line, the third one of the pixels converting a third wavelength of light into the third electrical signal;
supplying a fourth electrical signal from a fourth one of the pixels to the vertical signal line, the fourth one of the pixels converting a fourth wavelength of light into the fourth electrical signal;
supplying a fifth electrical signal from a fifth one of the pixels to a different vertical signal line, the first one of the pixels converting the first wavelength of light into the fifth electrical signal;
supplying a sixth electrical signal from a sixth one of the pixels to the different vertical signal line, the sixth one of the pixels converting the second wavelength of light into the sixth electrical signal;
supplying a seventh electrical signal from a seventh one of the pixels to the different vertical signal line, the seventh one of the pixels converting the third wavelength of light into the seventh electrical signal;
supplying an eighth electrical signal from an eighth one of the pixels to the different vertical signal line, the eighth one of the pixels converting the eighth wavelength of light into the eighth electrical signal;
outputting the first electrical signal onto the vertical signal line when a first selection pulse is at a scanning level along with a first trigger pulse being at a triggering level, the first trigger pulse is at the triggering level before a second trigger pulse is at the triggering level, and
outputting the fifth electrical signal onto the different vertical signal line when the second trigger pulse is at the triggering level along with a second selection pulse being at the scanning level, the second selection pulse is at the scanning level after the first selection pulse is at the scanning level;
outputting the second electrical signal onto the vertical signal line when a third selection pulse is at the scanning level along with a third trigger pulse being at the triggering level, the second trigger pulse is at the triggering level before the third trigger pulse is at the triggering level with the second selection pulse being at the scanning level before the third selection pulse is at the scanning level;
outputting the sixth electrical signal onto the different vertical signal line when a fourth selection pulse is at the scanning level along with a fourth trigger pulse being at the triggering level, the third trigger pulse is at the triggering level before the fourth trigger pulse is at the triggering level with the third selection pulse being at the scanning level before the fourth selection pulse is at the scanning level; and
outputting the third electrical signal onto the vertical signal line when a fifth selection pulse is at the scanning level along with a fifth trigger pulse being at the triggering level, the fourth trigger pulse is at the triggering level before the fifth trigger pulse is at the triggering level with the fourth selection pulse being at the scanning level before the fifth selection pulse is at the scanning level,
wherein the third one of the pixels is positioned between the first one of the pixels and the fifth one of the pixels, and wherein the fourth one of the pixels is positioned between the second one of the pixels and the sixth one of the pixels.

14. The method according to claim 13, further comprising:
outputting the seventh electrical signal onto the different vertical signal line when a sixth selection pulse is at the scanning level along with a sixth trigger pulse being at the triggering level, the fifth trigger pulse is at the triggering level before the sixth trigger pulse is at the triggering level with the fifth selection pulse being at the scanning level before the sixth selection pulse is at the scanning level.

15. The method according to claim 14, further comprising:
outputting the fourth electrical signal onto the vertical signal line when a seventh selection pulse is at the scanning level along with a seventh trigger pulse being at the triggering level, the sixth trigger pulse is at the triggering level before the seventh trigger pulse is at the triggering level with the sixth selection pulse being at the scanning level before the seventh selection pulse is at the scanning level.

16. The method according to claim 15, wherein the fifth one of the pixels is between the third one of the pixels and the seventh one of the pixels.

17. The method according to claim 15, further comprising:
outputting the eighth electrical signal onto the different vertical signal line when an eighth selection pulse is at the scanning level along with an eighth trigger pulse being at the triggering level, the seventh trigger pulse is at the triggering level before the eighth trigger pulse is at the triggering level with the seventh selection pulse being at the scanning level before the eighth selection pulse is at the scanning level.

18. The method according to claim 17, wherein the sixth one of the pixels is between the fourth one of the pixels and the eighth one of the pixels.

* * * * *